(12) United States Patent
Gattere et al.

(10) Patent No.: US 10,480,942 B2
(45) Date of Patent: Nov. 19, 2019

(54) MICROMECHANICAL DETECTION STRUCTURE OF A MEMS MULTI-AXIS GYROSCOPE, WITH REDUCED DRIFTS OF CORRESPONDING ELECTRICAL PARAMETERS

(71) Applicant: STMICROELECTRONICS S.R.L., Agrate Brianza (IT)

(72) Inventors: Gabriele Gattere, Castronno (IT); Carlo Valzasina, Gessate (IT); Luca Giuseppe Falorni, Limbiate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 199 days.

(21) Appl. No.: 15/273,312

(22) Filed: Sep. 22, 2016

(65) Prior Publication Data
US 2017/0284804 A1 Oct. 5, 2017

(30) Foreign Application Priority Data

Mar. 31, 2016 (IT) .......................... 102016000033203

(51) Int. Cl.
*G01C 19/5747* (2012.01)
*G01C 19/5712* (2012.01)

(52) U.S. Cl.
CPC ..... *G01C 19/5747* (2013.01); *G01C 19/5712* (2013.01)

(58) Field of Classification Search
CPC .......................... G01C 19/5747; G01C 19/5712
USPC ........................................................ 73/504.12
See application file for complete search history.

(56) References Cited

U.S. PATENT DOCUMENTS

| 2009/0223299 | A1* | 9/2009 | Kotovsky | ................. G01L 1/18 73/777 |
| 2011/0023604 | A1* | 2/2011 | Cazzaniga | ......... G01C 19/5712 73/514.32 |
| 2013/0239686 | A1 | 9/2013 | Cazzaniga et al. | |
| 2013/0277775 | A1* | 10/2013 | Roland | .............. G01C 19/5747 257/415 |
| 2014/0000367 | A1* | 1/2014 | Potasek | .............. G01C 19/5712 73/504.12 |

FOREIGN PATENT DOCUMENTS

EP 2 884 229 A1 6/2015

\* cited by examiner

*Primary Examiner* — Peter J Macchiarolo
*Assistant Examiner* — Tarun Sinha
(74) *Attorney, Agent, or Firm* — Seed IP Law Group LLP

(57) ABSTRACT

A multi-axis MEMS gyroscope includes a micromechanical detection structure having a substrate, a driving-mass arrangement, a driven-mass arrangement with a central window, and a sensing-mass arrangement which undergoes sensing movements in the presence of angular velocities about a first horizontal axis and a second horizontal axis. A sensing-electrode arrangement is fixed with respect to the substrate and is set underneath the sensing-mass arrangement. An anchorage assembly is set within the central window for constraining the driven-mass arrangement to the substrate at anchorage elements. The anchorage assembly includes a rigid structure suspended above the substrate that is elastically coupled to the driven mass by elastic connection elements at a central portion, and is coupled to the anchorage elements by elastic decoupling elements at end portions thereof.

21 Claims, 5 Drawing Sheets

MICROMECHANICAL DETECTION STRUCTURE OF A MEMS MULTI-AXIS GYROSCOPE, WITH REDUCED DRIFTS OF CORRESPONDING ELECTRICAL PARAMETERS

BACKGROUND

Technical Field

The present disclosure relates to a micromechanical detection structure of a MEMS (Micro-Electro-Mechanical Systems) multi-axis gyroscope, which has reduced drifts of the corresponding electrical parameters in the presence of thermal deformations, or stresses of various nature acting from outside on a corresponding package.

Description of the Related Art

In particular, the following discussion will make explicit reference, without this implying any loss of generality, to a biaxial MEMS gyroscope having a sensing-mass arrangement subjected to sensing movements along a vertical axis z, i.e., in a direction orthogonal to a horizontal plane of main extension and to the top surface of a corresponding substrate (in addition, possibly, to being able to perform further sensing movements in the same horizontal plane).

It is known that micromechanical detection structures of MEMS sensors with vertical axis z are generally subject to drift of electrical parameters, due to the deformations of a corresponding substrate of semiconductor material, on account, for example, of thermal phenomena, mechanical stresses of various nature acting from outside on the package of the same sensors (for example, due to soldering to a printed-circuit board), or swelling due to humidity.

FIG. 1 shows a micromechanical structure 1 of a known type, of a MEMS sensor with vertical axis z (which further comprises an electronic reading interface, not illustrated, electrically coupled to the same micromechanical structure).

The micromechanical structure 1 comprises: a substrate 2 (including semiconductor material, for example, silicon); and a sensing mass 3, which is of conductive material, for example, polysilicon, and is arranged above the substrate 2, suspended at a certain distance from its top surface.

The sensing mass 3 has a main extension in a horizontal plane xy, which is defined by a first horizontal axis x and a second horizontal axis y that are mutually orthogonal and is substantially parallel to the top surface of the substrate 2 (in a resting condition, in the absence, that is, of external quantities acting on the micromechanical structure 1), and a substantially lower dimension along the vertical axis z, which is perpendicular to the aforesaid horizontal plane xy and which forms with the first and second horizontal axes x, y a set of three Cartesian axes xyz.

The sensing mass 3 has, at the center, a through opening 4, which traverses it throughout its thickness. This through opening 4 has in top plan view a substantially rectangular shape, which extends in length along the first horizontal axis x and is set at the centroid (or center of gravity) O of the sensing mass 3. The through opening 4 consequently divides the sensing mass 3 into a first portion 3a and a second portion 3b, arranged on opposite sides with respect to the same through opening 4 along the second horizontal axis y.

As illustrated schematically also in FIG. 2a, the micromechanical structure 1 further comprises a first fixed electrode 5a and a second fixed electrode 5b, of conductive material, which are arranged on the top surface of the substrate 2, on opposite sides with respect to the through opening 4 along the second horizontal axis y, to be positioned, respectively, underneath the first and second portions 3a, 3b of the sensing mass 3, at a respective distance of separation (or gap) $\Delta z_1$, $\Delta z_2$ (which, in resting conditions, have substantially the same value).

The first and second fixed electrodes 5a, 5b define, together with the sensing mass 3, a first sensing capacitor and a second sensing capacitor with plane and parallel faces, which are designated as a whole by $C_1$, $C_2$ and have a given value of capacitance at rest.

The sensing mass 3 is anchored to the substrate 2 by a central anchorage element 6, constituted by a pillar element, which extends within the through opening 4 starting from the top surface of the substrate 2, centrally with respect to the through opening 4. The central anchorage element 6 corresponds to the only point of constraint of the sensing mass 3 to the substrate 2.

In particular, the sensing mass 3 is mechanically connected to the central anchorage element 6 by a first elastic anchorage element 8a and a second elastic anchorage element 8b, which extend within the through opening 4, aligned, with a substantially rectilinear extension, along an axis of rotation A parallel to the first horizontal axis x, on opposite sides with respect to the central anchorage element 6. The elastic anchorage elements 8a, 8b are configured to be compliant to torsion about their direction of extension, thus enabling rotation of the sensing mass 3 out of the horizontal plane xy (in response to an external quantity to be detected, for example, an acceleration or an angular velocity).

Due to rotation, the sensing mass 3 approaches one of the two fixed electrodes 5a, 5b (for example, the first fixed electrode 5a) and correspondingly moves away from the other of the two fixed electrodes 5a, 5b (for example, from the second fixed electrode 5b), generating opposite capacitive variations of the sensing capacitors $C_1$, $C_2$.

Suitable interface electronics (not illustrated in FIG. 1) of the MEMS sensor, electrically coupled to the micromechanical structure 1, receives at input the capacitive variations of the sensing capacitors $C_1$, $C_2$, and processes these capacitive variations in a differential manner for determining the value of the external quantity to be detected.

The present Applicant has realized that the micromechanical structure 1 described previously may be subject to measurement errors in case the substrate 2 undergoes deformation.

The package of a MEMS sensor is in fact subject to deformation as the temperature varies, these deformation due to the different coefficients of thermal expansion of the materials of which it is made, causing corresponding deformations of the substrate 2 of the micromechanical structure 1 contained therein. Similar deformations may further occur on account of particular stresses induced from outside, for example, during soldering of the package on a printed-circuit board, or else on account of phenomena of swelling due to humidity.

As illustrated schematically in FIG. 2b, due to the deformations of the substrate 2, the fixed electrodes 5a, 5b, which are directly constrained thereto (these electrodes are in general set on the top surface of the substrate 2), follow the same deformations of the substrate, while the sensing mass 3 moves, following the displacements of the central anchorage element 6.

Deformation of the substrate 2 may cause both a variation, or drift, of static offset (at time zero) or of the so-called output in response to a zero input (ZRL—Zero-Rate Level), i.e., of the value supplied at output in the absence of quantities to be detected (for example, in the absence of an angular velocity acting from the outside), and a variation of sensitivity in the detection of quantities.

In the example illustrated, the substrate 2 and the corresponding top surface undergo a deformation along the vertical axis z with respect to the second horizontal axis y (in the example, a bending), and, due to this deformation, variations occur in the average distances (or gaps) $\Delta z_1$ and $\Delta z_2$ that separate the sensing mass 3 from the substrate 2 at the first and second fixed electrodes 5a, 5b.

The aforesaid variations of distance cause corresponding variations of the capacitance of the sensing capacitors $C_1$, $C_2$ that are not linked to the quantity to be detected and thus cause undesired variations of the sensing performance of the micromechanical structure 1.

In particular, in the case where the deformation of the substrate 2 causes substantially equal variations of the gaps $\Delta z_1$ and $\Delta z_2$, a variation of the sensitivity of detection of the micromechanical structure 1 occurs (understood as ratio $\Delta C/\Delta z$). In the case of differential variation of the gaps $\Delta z_1$ and $\Delta z_2$, a capacitive offset at time zero occurs and/or a variation of the ZRL during operation of the MEMS sensor.

To overcome the above drawbacks, solutions have been proposed, designed in general to eliminate, or at least reduce, the effects of the deformations of the substrate 2 on the micromechanical structure 1.

For instance, document No. US 2011/0023604 A1, filed in the name of the present Applicant, describes a micromechanical detection structure for a MEMS inertial accelerometer with a single sensing axis (the vertical axis z), which has reduced drifts.

In brief, this solution basically envisages anchorage of the sensing mass of the micromechanical structure at anchorages (or points of constraint to the substrate) set in the proximity of the fixed electrodes. In this way, deformations of the substrate affect in a substantially similar way the position of the fixed electrodes and the arrangement of the sensing mass, minimizing the effects of these deformations.

The solution described in the aforesaid document US 2011/0023604 A1 refers, however, only to a micromechanical structure of a uniaxial inertial accelerometer. In particular, there is no reference to how the solution described may be adopted in more complex detection structures, such as, for example, that of a multi-axis MEMS gyroscope in which it is necessary to co-ordinate multiple driving and sensing movements, without altering the characteristics of the same movements.

In a known way, MEMS gyroscopes operate on the principle of relative accelerations, exploiting Coriolis acceleration. When an angular velocity is applied to a moving mass of a corresponding micromechanical detection structure, which is driven in a linear direction, the mobile mass "feels" an apparent force, or Coriolis force, which causes a displacement thereof in a direction perpendicular to the linear driving direction and to the axis about which the angular velocity is applied. The mobile mass is supported above a substrate via elastic elements that enable driving thereof in the driving direction and displacement in the direction of the apparent force, which is directly proportional to the angular velocity and may, for example, be detected via a capacitive transduction system.

BRIEF SUMMARY

The present disclosure provides a micromechanical structure of a multi-axis MEMS gyroscope having reduced drift of its electrical parameters, for example in terms of output signal in response to a zero input (ZRL) and of in terms of sensitivity, in the presence of deformations of the corresponding substrate.

BRIEF DESCRIPTION OF THE SEVERAL VIEWS OF THE DRAWINGS

For a better understanding of the present disclosure, a preferred embodiment thereof is now described, purely by way of non-limiting example and with reference to the attached drawings, wherein.

DETAILED DESCRIPTION

Figure 3:
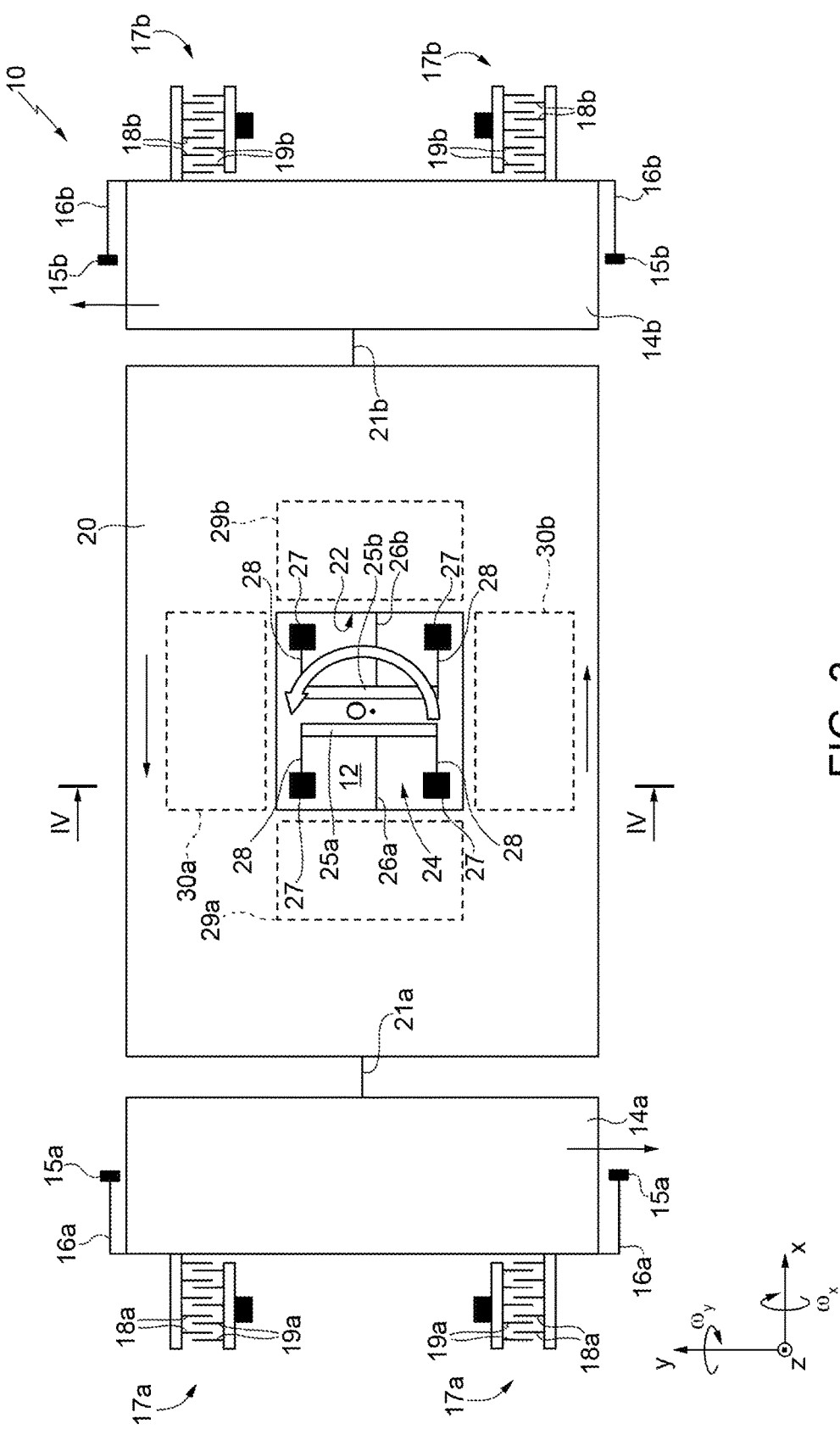
FIG. 3 is a schematic top plan view of a micromechanical detection structure of a multi-axis MEMS gyroscope according to a first embodiment of the present disclosure.

FIG. 3 is a schematic illustration of a first embodiment of a micromechanical detection structure of a multi-axis MEMS gyroscope, designated as a whole by 10, provided in a body (die) of semiconductor material, for example, silicon, including a substrate 12.

The micromechanical structure 10 has a substantially planar configuration with main extension in the horizontal plane xy, and minor dimension, as compared to the aforesaid main extension, in a direction parallel to the vertical axis z.

The micromechanical structure 10 comprises a first driving mass 14a and a second driving mass 14b, with extension in the horizontal plane xy (purely by way of example, substantially rectangular) and connected to respective anchorages 15a, 15b, fixed with respect to the substrate 12, by respective elastic anchorage elements 16a, 16b.

A respective set of driving electrodes 17a, 17b is associated with each driving mass 14a, 14b. Each set of driving electrodes 17a, 17b comprises: a respective plurality of mobile electrodes 18a, 18b, which are fixed with respect to the respective driving mass 14a, 14b and extend outside the driving mass 14a, 14b; and a respective plurality of fixed electrodes 19a, 19b, fixed with respect to the substrate 12 and comb-fingered to the mobile electrodes 18a, 18b.

Suitable electrical biasing signals from an electronic circuit (here not illustrated) for driving the MEMS gyroscope, determine, by mutual and alternating electrostatic attraction of the electrodes, an oscillatory driving movement of the driving masses 14a, 14b in a linear driving direction, in the example, along the second horizontal axis y. In particular, the first and second driving masses 14a, 14b are driven in opposite senses of this driving direction, as indicated by the arrows in FIG. 3. The elastic anchorage elements 16a, 16b are thus configured to be compliant with respect to this driving movement.

The micromechanical structure 10 further comprises a driven mass 20, set between the first and second driving masses 14a, 14b (in the direction of the first horizontal axis x) and connected to the same driving masses 14a, 14b by elastic connection elements 21a, 21b.

The driven mass 20 is suspended above the substrate 12, parallel thereto in a resting condition (i.e., in the absence of quantities to be detected).

The driven mass 20 has a main extension in the horizontal plane xy, with a shape that is, for example, rectangular, and a central window 22 (or through opening) that centrally defines an empty space, the center O of which coincides with the centroid and the center of symmetry of the entire micromechanical structure 10.

A coupling assembly 24 is arranged within the central window 22 and, according to a particular aspect of the present solution, is configured for anchorage of the driven mass 20 to the substrate 12.

In particular, the coupling assembly 24 comprises a pair of rigid elements 25a, 25b, which in the example have a rectilinear extension along the second horizontal axis y, arranged centrally to the central window 22, symmetrically with respect to the second horizontal axis y.

The aforesaid rigid elements 25a, 25b are, for example, formed via chemical etching of the same layer of material (for example, polysilicon), during the same process step as that in which the driven mass 20 is obtained.

Each rigid element 25a, 25b is elastically connected to the driven mass 20 by a respective elastic connection element 26a, 26b, which extends in the central window 22 starting from a central portion of the respective rigid element 25a, 25b as far as a facing side of the driven mass 20 (which defines the central window 22). The elastic connection elements 26a, 26b are, in the example illustrated in FIG. 3, aligned with a substantially rectilinear extension, along the first horizontal axis x, on opposite sides with respect to the center O (different embodiments for the elastic connection elements 26a, 26b may, however, be envisaged, for example, having an "L" shape).

The elastic connection elements 26a, 26b are configured to be compliant to torsion about their direction of extension, enabling, in this embodiment, rotation of the driven mass 20 out of the horizontal plane xy (as described in detail hereinafter), about the axis of rotation defined by the same elastic connection elements 26a, 26b.

Furthermore, each rigid element 25a, 25b is connected, at respective terminal ends, to anchorage elements 27, set in contact with, and on top of, the substrate 12, fixed with respect thereto (for example, being constituted by column elements, which extend vertically starting from the substrate 12), by respective elastic decoupling elements 28.

In the embodiment illustrated in FIG. 3, the elastic decoupling elements 28 have a linear extension along the first horizontal axis x, and a length smaller than that of the elastic connection elements 26a, 26b. Furthermore, the anchorage elements 27 are set, within the central window 22, according to appropriate criteria that will be clarified in what follows.

The rigid elements 25a, 25b are configured to have a high stiffness as compared to the elastic connection elements 26a, 26b and to the elastic decoupling elements 28. The extension of these rigid elements 25a, 25b is, in the absence of deformations of the substrate 12, to be considered as lying in the horizontal plane xy. In other words, their value of stiffness is such that that the rigid elements 25a and 25b may reasonably be considered as rigid bodies, even in the presence of maximum tolerable deformations of the substrate 12.

Each elastic decoupling element 28 is configured, together with the respective anchorage element 27 to define an element of constraint of the hinge type with respect to the substrate 12. In addition, the elastic decoupling elements 28 have a much higher stiffness than the elastic connection elements 26a, 26b, so that the rigid elements 25a, 25b may be considered as substantially immobile with respect to the driven mass 20, during motion of the structure, whether it is a driving motion or a sensing motion (as described in greater detail hereinafter).

The micromechanical structure 10 further comprises: a first pair of sensing electrodes 29a, 29b, arranged on the substrate 12 and fixed with respect thereto, underneath the driven mass 20, on opposite sides of the central window 22 along the first horizontal axis x; and moreover a second pair of sensing electrodes 30a, 30b, arranged on the same substrate 12 and fixed with respect thereto, underneath the driven mass 20, on opposite sides with respect to the central window 22 along the second horizontal axis y.

In particular, according to one aspect of the present solution, the anchorage elements 27 are arranged, in pairs, in a position corresponding to, and in the proximity of, a respective sensing electrode 29a, 29b, 30a, 30b.

In general, at least one point of constraint (defined by a respective anchorage element 27 and elastic decoupling element 28) of the driven mass to the substrate 12 is provided in a position corresponding to each sensing electrode 29a, 29b, 30a, 30b. In the example illustrated in FIG. 3, four points of constraint are, for example, provided, two of which are arranged at the sensing electrode 30a, and the other two are arranged at the sensing electrode 30b, in a way substantially symmetrical with respect to the center O of the central window 22 (likewise, a first pair of points of constraint is set at the sensing electrode 29a, and a second pair of points of constraint is set at the sensing electrode 29b).

During operation, the coupling assembly 24 is configured to allow a rotation of the driven mass 20 in the horizontal plane xy (with respect to the substrate 12) about the vertical axis z, in response to the driving movement in opposite senses of the driving masses 14a, 14b (as represented by the arrows). Basically, the driven mass 20 is driven in rotation (in the example, in the counterclockwise direction) by the movement of the driving masses 14a, 14b, to generate tangential forces on the driven mass 20 itself, in particular directed along the first horizontal axis x, in opposite senses, at the sensing electrodes 30a, 30b.

In response to this driving movement of the driving masses 14a, 14b, and in the presence of an angular velocity about the first horizontal axis x, designated by $\omega_x$, a couple of Coriolis forces is generated on the driven mass 20, having direction along the vertical axis z and opposite senses, and thus causing a respective rotation out of the horizontal plane xy, in the example about the second horizontal axis y.

The sensing electrodes 29a, 29b enable, by capacitive coupling, the detection of a quantity indicative of the value of the aforesaid angular velocity $\omega_x$ about the first horizontal axis x (which thus represents a first sensing axis for the MEMS gyroscope).

In the presence of an angular velocity about the second horizontal axis y, designated by $\omega_y$, Coriolis forces on the driven mass 20 directed along the vertical axis z are further generated (in opposite senses, at the sensing electrodes 30a, 30b), which cause a rotation thereof out of the horizontal plane xy, in the example about the axis of rotation defined by the elastic connection elements 26a, 26b, in a direction parallel to first horizontal axis x.

The sensing electrodes 30a, 30b enable, by capacitive coupling with the driven mass 20, detection of an electrical quantity indicative of the value of the aforesaid angular velocity $\omega_y$ about the second horizontal axis y (which thus represents a second sensing axis for the MEMS gyroscope).

Figure 1:
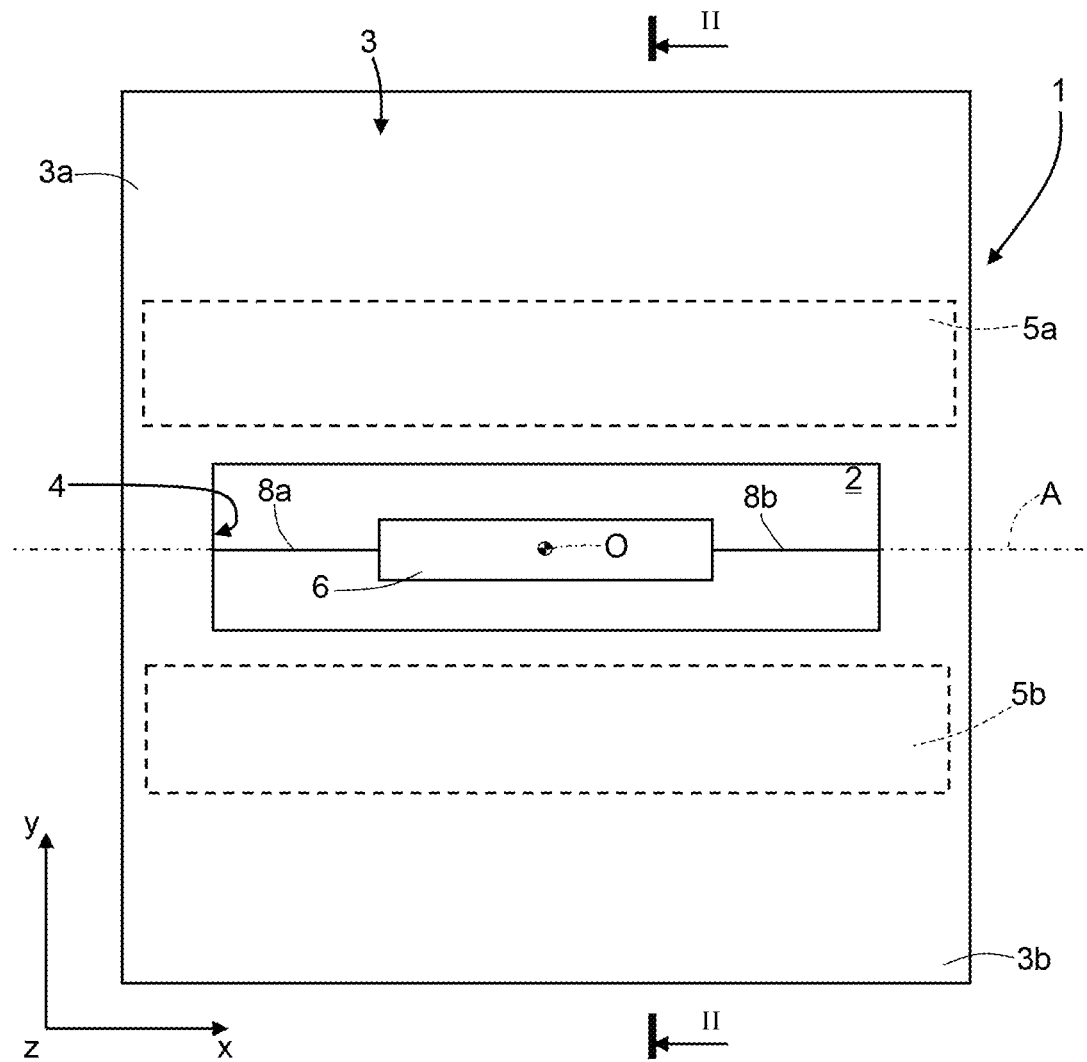
FIG. 1 is a top plan view of a micromechanical structure of a MEMS sensor with vertical axis z, of a known type.
Figure 2A:
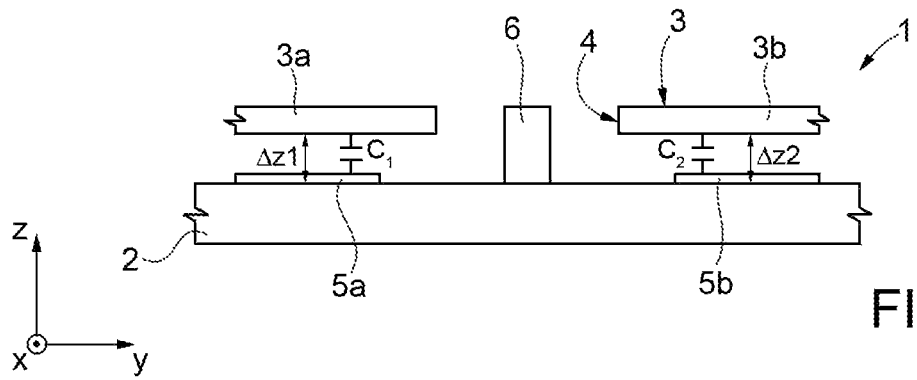
FIG. 2a is a cross-sectional view of the micromechanical structure of FIG. 1a, taken along the line II-II of FIG. 1.
Figure 2B:
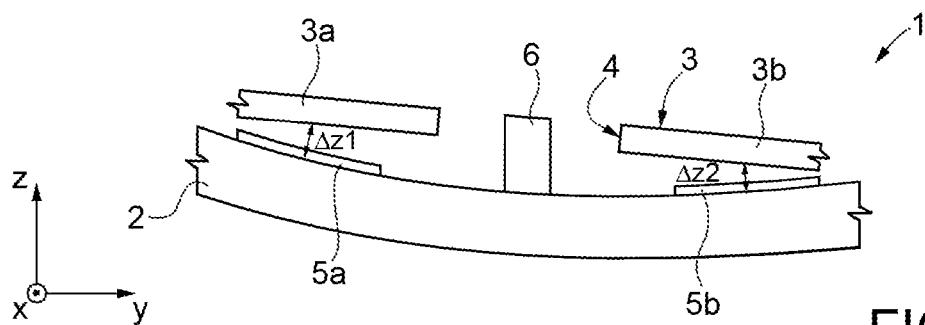
FIG. 2b is a cross-sectional view, similar to that of FIG. 2a, in the presence of a deformation of the substrate of the micromechanical structure.
Figure 4A:
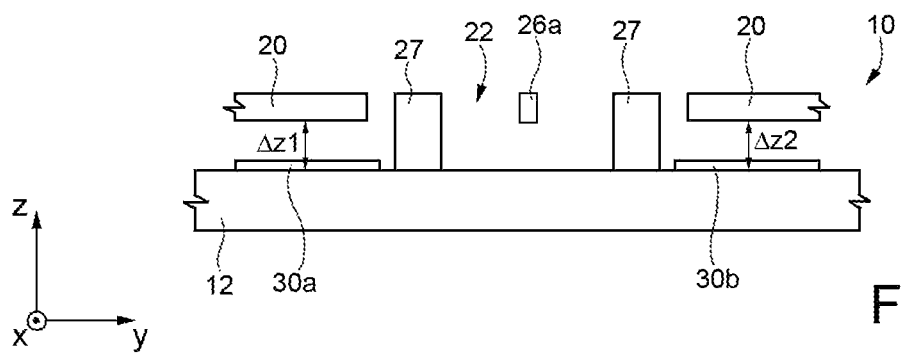
FIG. 4a is a cross-sectional view of the micromechanical structure of FIG. 3, taken along the line IV-IV of FIG. 3.
Figure 4B:
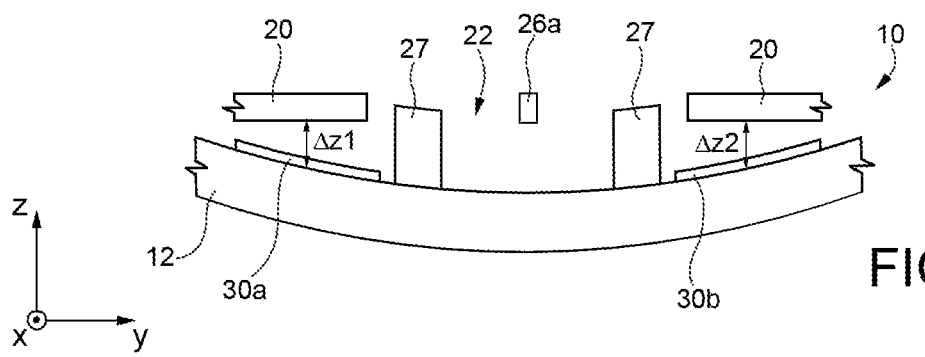
FIG. 4b is a cross-sectional view similar to that of FIG. 4a, in the presence of a deformation of the substrate of the micromechanical structure.

As shown schematically in FIG. 4a (which represents a condition at rest) and in FIG. 4b (which represents a condition of deformation of the substrate 12), in the presence of deformations of the substrate 12, the arrangement of the anchorage elements 27, in the example at the sensing electrodes 30a, 30b, advantageously enables reduction of the mean value of variations $\Delta z_1$ and $\Delta z_2$, with respect to the resting condition, of the gaps that separate the driven mass 20 (in this case acting also as sensing mass) from the sensing electrodes 30a, 30b. These gaps have substantially corresponding variations $\Delta z_1$ and $\Delta z_2$, which do not differ considerably from one another.

Furthermore, the elastic decoupling elements 28 advantageously enable reduction of the mean value of inclination of the driven mass 20 with respect to the substrate 12, absorbing and compensating, in fact, possible stresses and rotations of the substrate 12 at the anchorage elements 27.

Consequently, any undesired variation of the electrical detection parameters of the micromechanical structure 10 (for example, in terms of ZRL and sensitivity) is prevented.

In greater detail, in the presence of a displacement of the substrate 12 (and, therewith, of the sensing electrodes 30a, 30b) along the vertical axis z, due, for example, to a deformation as a function of temperature, the points of constraint shift along the vertical axis z, substantially in a manner corresponding to the fixed electrodes 30a, 30b, and similar displacements are transmitted to the rigid elements 25a, 25b by the elastic decoupling elements 28. Due to such displacements, the rigid elements 25a, 25b move, setting themselves in a plane that interpolates the new positions assumed by the points of constraint. In particular, the errors between the interpolated plane and the positions of the individual points of constraint are compensated by the deformations of the elastic decoupling elements 28, which further compensate any possible expansion of the substrate 12.

Given the stiffness of the elastic decoupling elements 28, the driven mass 20 follows directly the displacement of the rigid elements 25a, 25b, setting itself accordingly in space. In other words, the driven mass 20 is rigidly connected to the rigid elements 25a, 25b in following the deformations of the substrate 12 along the orthogonal axis z.

Consequently, the driven mass 20 also undergoes a displacement substantially corresponding to the displacement of the fixed electrodes 30a, 30b, thus in effect reducing the (mean) variation of the gaps $\Delta z_1$ and $\Delta z_2$ between the driven mass 20 and the fixed electrodes 30a, 30b, with the result that no appreciable changes occur in the values of sensitivity and offset at output from the MEMS gyroscope.

The arrangement of the points of constraint in the proximity of the fixed electrodes 30a, 30b is thus per se advantageous in so far as it causes the driven mass 20 to undergo displacements that may be approximated to the mean displacements of the same fixed electrodes 30a, 30b, thus reducing the drifts in the electrical values at output from the MEMS gyroscope. In particular, using a mathematical modelling of the micromechanical structure 10, it is advantageously possible to determine the optimal specific position of the points of constraint (and of the corresponding anchorage elements 27) such as to effectively minimize the mean variation of the gaps $\Delta z_1$ and $\Delta z_2$ between the driven mass 20 and the fixed electrodes 30a, 30b (similar considerations apply, of course, to the fixed electrodes 29a, 29b).

For instance, it is possible to use an iterative procedure to determine, in the stage of design and manufacturing of the micromechanical structure 10, a best position of the points of constraint enabling minimization of the drifts of sensitivity and offset of the sensor in the presence of deformation of the substrate 12.

Figure 5:
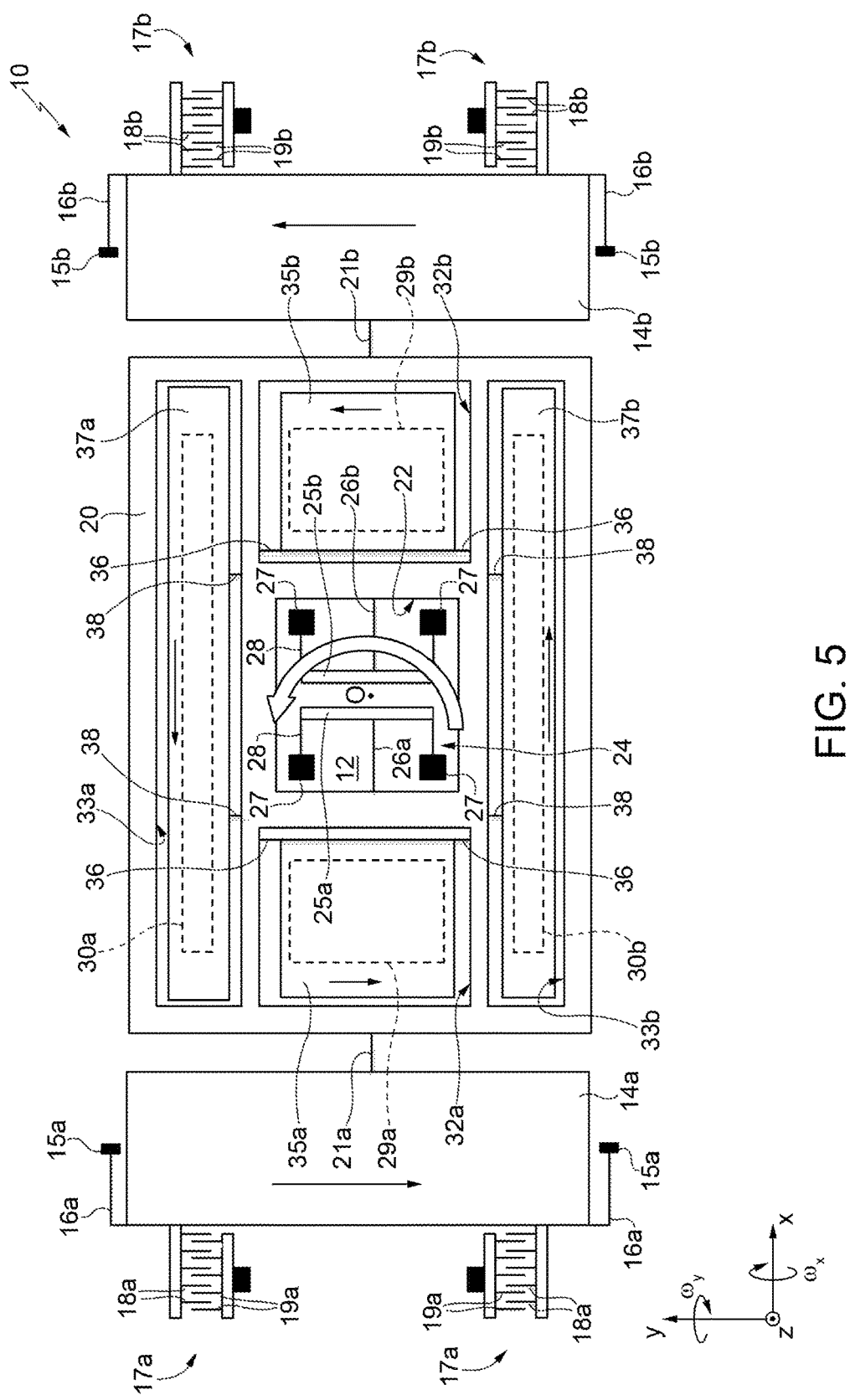
FIG. 5 is a schematic top plan view of a micromechanical detection structure of a multi-axis MEMS gyroscope according to a second embodiment of the present disclosure.

With reference to FIG. 5, a description is presented of a second embodiment of a micromechanical detection structure of a multi-axis MEMS gyroscope, designated once again by 10 (in general, elements that are similar to others illustrated previously are designated by the same reference numbers and are not described herein again in detail).

In this embodiment, the driven mass 20 is again driven in its movement of rotation about the vertical axis z by the first and second driving masses 14a, 14b (in a way altogether similar to what has been described previously with reference to FIG. 3), to which it is once again connected by the elastic connection elements 21a, 21b.

In the driven mass 20, once again as described previously, the central opening 22 defines the empty space in which the coupling assembly 24 is located (provided in a way altogether similar to what has been described previously).

In this case, the driven mass 20 further has two further pairs of windows (or through openings), provided therein, laterally with respect to the central window 22, namely: a first pair of lateral windows 32a, 32b, set on opposite sides of the central window 22, aligned along the first horizontal axis x; and a second pair of lateral windows 33a, 33b, set on opposite sides of the central window 22, aligned along the second horizontal axis y.

The micromechanical structure 10 in this case comprises further and distinct sensing masses, which are designed for detecting angular velocities along the horizontal axes x, y, and are set within the aforesaid lateral windows. Neither the driven mass 20 nor the driving masses 14a, 14b have in this case the function of detecting angular velocities (and are not capacitively coupled to sensing electrodes).

In detail, the micromechanical structure 10 comprises a first pair of sensing masses 35a, 35b, each set within a respective lateral window 32a, 32b of the first pair, suspended above the substrate 12 and connected to the driven mass 20 by elastic suspension elements 36.

In particular, the elastic suspension elements 36, of a torsional type, extend parallel to the second horizontal axis y, on opposite sides of a terminal portion of the respective sensing mass 35a, 35b, which is arranged in the proximity of the central window 22 so that the same sensing masses 35a, 35b are set in cantilever fashion above the substrate 12, i.e., with a corresponding centroid set at an appropriate distance from the axis of rotation constituted by the elastic suspension elements 36.

During operation, in the presence of an angular velocity about the first horizontal axis x (angular velocity $\omega_x$), a Coriolis force is generated on the sensing masses 35a, 35b directed along the vertical axis z, which causes a respective rotation thereof out of the horizontal plane xy, about the axis of rotation defined by the aforesaid elastic suspension elements 36, in opposite senses of the same vertical axis z.

Conveniently, the sensing electrodes 29a, 29b are in this case provided on the substrate 12 underneath the sensing masses 35a, 35b. In addition, the anchorage elements 27 coupled to the rigid elements 25a, 25b of the coupling assembly 24 are in this case set in the proximity of these sensing electrodes 29a, 29b.

The micromechanical structure 20 further comprises a second pair of sensing masses 37a, 37b, each set within a respective lateral window 33a, 33b of the second pair, suspended above the substrate 12 and connected to the driven mass 20 by respective elastic suspension elements 38.

During operation, in the presence of an angular velocity about the second horizontal axis y (angular velocity $\omega_y$), Coriolis forces are generated on the sensing masses 37a, 37b directed in opposite senses along the vertical axis z, which cause a respective rotation thereof out of the horizontal plane xy, about an axis of rotation, parallel to the first horizontal axis x, passing through the points of coupling with the aforesaid elastic suspension elements 38.

The sensing electrodes 30a, 30b, set on the substrate 12 underneath the sensing masses 37a, 37b, enable, by capacitive coupling with the sensing masses 37a, 37b, detection of a quantity indicative of the value of angular velocity $\omega_y$.

The anchorage elements 27 coupled to the rigid elements 25a, 25b of the coupling assembly 24 are in this case set also in the proximity of the aforesaid sensing electrodes 30a, 30b.

Thus, in a way altogether similar to what has been discussed with reference to the first embodiment of FIG. 3, the coupling assembly 24 of the micromechanical structure 10 enables effective compensation of possible deformations of the substrate 12 and reduction and minimization of drifts of the electrical parameters for detection of the angular velocity.

The advantages of the solutions proposed emerge clearly from the foregoing description.

In any case, it is once again underlined that the micromechanical detection structure 10 of the MEMS gyroscope is substantially insensitive to deformations of the substrate (for example, due to temperature variations, external stresses, such as the ones due to soldering to a printed-circuit board or to the presence of humidity). The variations of offset and sensitivity as a function of the deformations of the substrate are in fact extremely low (substantially zero), thus minimizing in general the drifts of the electrical parameters.

In particular, thanks to the solution described, these effects are advantageously achieved without affecting in any way the movements of driving and sensing of the angular velocities envisaged in the MEMS gyroscope.

The solutions described for anchorage and support of the driven mass 20 with respect to the substrate 12 do not entail any substantial modification as regards the modalities of detection of the angular velocities and general operation of the MEMS gyroscope.

Advantageously, the micromechanical structure 10 further has overall dimensions comparable to those of traditional solutions (i.e., ones that envisage a single central anchorage).

The second embodiment, illustrated with reference to FIG. 5, may further provide specific advantages as compared to the first embodiment, in so far as it enables higher sensitivity values, a lower effect of disturbance between the two axes of angular velocity detection (as regards the so-called "cross-axis sensitivity"), and also a greater effect of rejection of disturbance linked to deformations of the substrate 12 (in this second embodiment, the anchorage elements 27 are set in proximity to the sensing electrodes 29a-29b, 30a-30b associated with both of the sensing axes).

Figure 6:
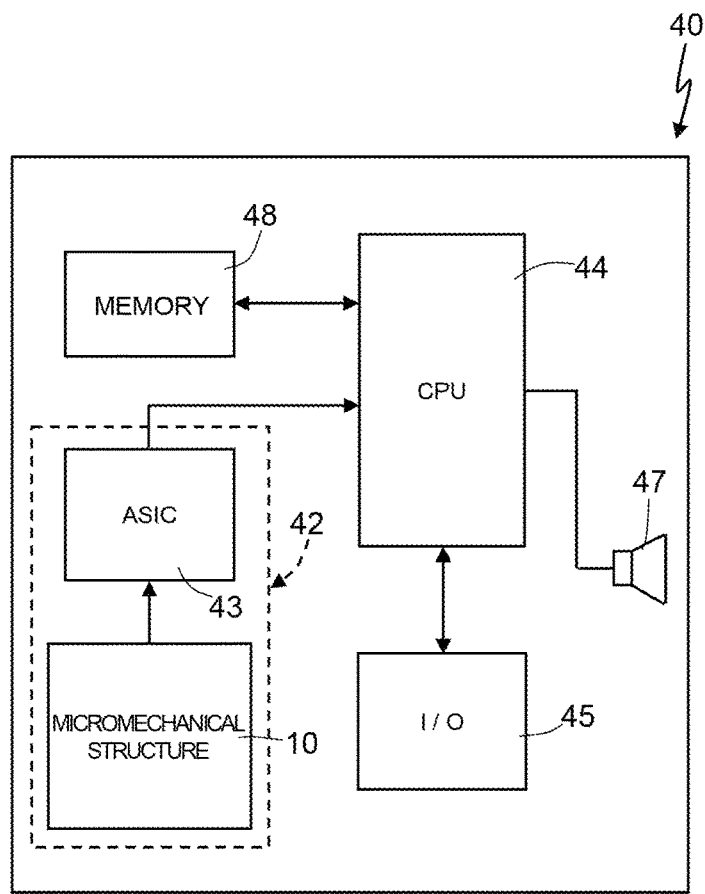
FIG. 6 is a general block diagram of an electronic device incorporating the MEMS gyroscope of FIG. 3 or 5 according to a further aspect of the present disclosure.

In any case, use of the micromechanical structure 10 and of the corresponding MEMS gyroscope is particularly advantageous in an electronic device 40 of a portable or wearable type, as illustrated schematically in FIG. 6.

In particular, in this FIG. 6, the MEMS gyroscope is designated by 42, and includes the micromechanical structure 10 previously described and an ASIC 43, which provides the corresponding reading interface (and may be provided in the same die as that of the micromechanical structure 10 or in a different die, which may in any case be housed in a same package).

The electronic device 40 is preferably a mobile-communication portable device, such as a cellphone, a PDA (Personal Digital Assistant), a portable computer, but also a digital audio player with voice-recording capacity, a photographic camera or video camera, a controller for video games, etc.; the electronic device 40 may further be a wearable device, such as a watch or bracelet.

The electronic device 40 is generally able to process, store, and/or transmit and receive signals and information, and comprises: a microprocessor 44, which receives the signals detected by the MEMS gyroscope 42; and an input/output interface 45, for example, provided with a keypad and a display, coupled to the microprocessor 44. Furthermore, the electronic device 40 may comprise a speaker 47, for generating sounds on an audio output (not illustrated), and an internal memory 48.

Finally, it is clear that modifications and variations may be made to what has been described and illustrated herein, without thereby departing from the scope of the present disclosure, as defined in the annexed claims.

For instance, the number of points of constraint with which the driven mass 20 is mechanically coupled to the substrate 12 could vary with respect to what has been illustrated, being possible to use a smaller or greater number thereof. Of course, the use of a number of points of constraint of less than four entails a progressive reduction of the capacity of compensation of the deformations of the substrate 12, whereas the use of a greater number of points of constraint, albeit enabling greater compensation of the deformations, entails a greater complexity of the micromechanical structure 10.

The number of sensing electrodes could vary with respect to what has been illustrated; a greater number of electrodes may in fact be present (for example, shorted with respect to one another according to appropriate electrode arrangements, that are to form, as a whole, the two sensing capacitors $C_1$, $C_2$ with corresponding sensing masses), or else even just one sensing electrode in the case where a differential sensing scheme is not adopted.

Figure 7:
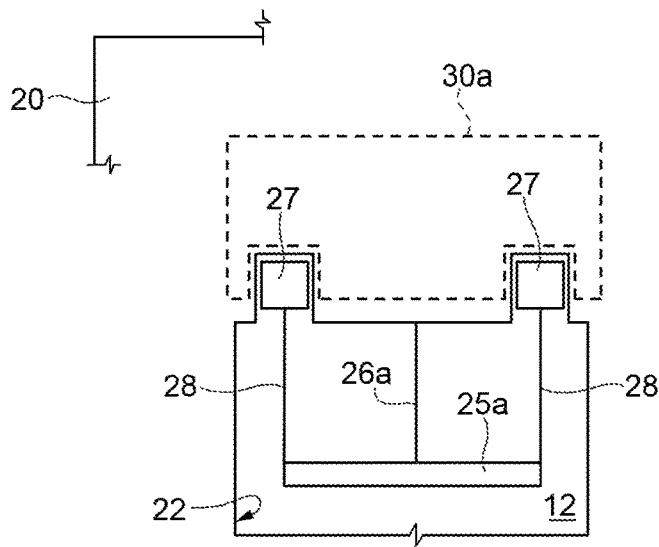
FIG. 7 shows an embodiment of a sensing electrode of the micromechanical structure of the MEMS gyroscope of FIG. 3 or 5 according to a possible variant embodiment of the present disclosure.

Furthermore, as illustrated in the detail of FIG. 7, each sensing electrode 29a-29b, 30a-30b (the figure illustrates by way of example just the sensing electrode 30a) may be shaped so as to include within its overall dimensions, or envelope region, in the horizontal plane xy, a base portion of the respective anchorage elements 27 for further reducing the effects associated with the deformations of the substrate 12.

In this case, each sensing electrode has recesses designed to house at least partially a base portion of a corresponding anchorage element 27, which is coupled to the substrate 12. Likewise, the central window 22 has corresponding extensions above the sensing electrodes.

Finally, it is clear that the solution described may be advantageously applied also to further types of MEMS sensors, for example, triaxial gyroscopes capable of detecting angular velocities also about a third sensing axis (the so-called angular velocities of yaw), which in this case comprise a further sensing-mass arrangement (in a way here not discussed in detail).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multi-axis MEMS gyroscope, comprising:
   a micromechanical detection structure having a main extension in a horizontal plane, the micromechanical detection structure including:
   a substrate including semiconductor material;
   a driving-mass arrangement configured to be driven in a driving movement;
   a driven-mass arrangement having a central window, the driven-mass arrangement coupled elastically to said driving-mass arrangement and configured to be driven in motion by said driving movement;
   a sensing-mass arrangement configured to perform, in response to motion of the driven-mass arrangement and in the presence of a first angular velocity about a first horizontal axis of the horizontal plane, a first detection movement of rotation out of the horizontal plane about a second horizontal axis of the horizontal plane, perpendicular to the first horizontal axis, and further configured to perform, in response to motion of the driven-mass arrangement and in the presence of a second angular velocity about the second horizontal axis of the horizontal plane, a second detection movement of rotation out of the horizontal plane about the first horizontal axis;
   a sensing-electrode arrangement fixed with respect to the substrate and capacitively coupled to the sensing-mass arrangement; and
   an anchorage assembly arranged within the central window of the driven-mass arrangement, the anchorage assembly elastically coupled to the driven-mass arrangement, and configured to constrain the driven-mass arrangement to the substrate at anchorage elements, wherein
   said anchorage assembly includes a rigid structure that is suspended above said substrate,
   the rigid structure includes a pair of rigid elements that extend along the second horizontal axis and that are arranged symmetrically with respect to the second horizontal axis in the central window,
   each of the pair of rigid elements is elastically coupled to the driven-mass arrangement by a respective elastic connection element that extends from a central portion of a respective rigid element to the driven-mass arrangement,
   and each of the pair of rigid elements is coupled, at respective terminal ends of the rigid element, to respective anchorage elements by respective elastic decoupling elements, and
   said anchorage elements are positioned at a distance from said elastic connection elements and proximate to said sensing-electrode arrangement in the horizontal plane.

2. The multi-axis MEMS gyroscope according to claim 1, wherein said elastic decoupling elements are configured to elastically decouple said rigid structure from deformations of said substrate due to one or more of thermal drifts, mechanical stresses, and humidity absorption.

3. The multi-axis MEMS gyroscope according to claim 1, wherein the anchorage elements are positioned proximate to said sensing-electrode arrangement to minimize a mean of the variations of gaps between said sensing-mass arrangement and said sensing-electrode arrangement.

4. The multi-axis MEMS gyroscope according to claim 1, wherein said anchorage assembly is configured so that said rigid structure is substantially immobile with respect to said first and second angular velocities.

5. The multi-axis MEMS gyroscope according to claim 1, wherein said driven-mass arrangement comprises a driven mass having internally a first pair of lateral windows set laterally with respect to the central window and aligned along the first horizontal axis; and wherein said sensing-mass arrangement comprises a first pair of sensing masses, each of which is set within a respective lateral window of said first pair of lateral windows, is suspended above the substrate, and is coupled to the driven mass by respective elastic suspension elements; and wherein said elastic suspension elements, of a torsional type, extend parallel to the second horizontal axis on opposite sides of a terminal portion of the respective sensing masses so that said sensing masses are set in cantilever fashion above said substrate.

6. The multi-axis MEMS gyroscope according to claim 5, wherein said sensing-electrode arrangement comprises a first pair of sensing electrodes set on the substrate underneath said first pair of sensing masses.

7. The gyroscope according to claim 6, wherein said driven mass further has internally a second pair of lateral windows set laterally with respect to the central window and aligned along the second horizontal axis; and wherein said sensing-mass arrangement comprises a second pair of sensing masses, each of which is set within a respective lateral window of said second pair of lateral windows and is coupled to the driven mass by respective elastic suspension elements suspended in cantilever fashion above said substrate.

8. The multi-axis MEMS gyroscope according to claim 7, wherein said sensing-electrode arrangement comprises a second pair of sensing electrodes set on the substrate underneath said second pair of sensing masses.

9. The multi-axis MEMS gyroscope according to claim 1, wherein said driving-mass arrangement is coupled to a set of driving electrodes and is configured to be driven in said driving movement based upon electrical biasing of said set of driving electrodes; wherein said driving movement is a movement of translation along the second horizontal axis such as to drive said driven-mass arrangement into rotation about said vertical axis.

10. The multi-axis MEMS gyroscope according to claim 1, wherein the elastic connection elements extend within said central window and are aligned to define an axis of rotation out of the horizontal plane for said driven-mass arrangement.

11. An electronic device, comprising:
    a MEMS gyroscope including a micromechanical detection structure having a main extension in a horizontal plane, the micromechanical detection structure including:
    a substrate including a surface parallel to the horizontal plane;

a driving-mass structure positioned over the surface of the substrate and configured to oscillate in the horizontal plane;

a driven-mass structure positioned over the surface of the substrate and including a central window, the driven-mass structure elastically coupled to the driving-mass structure and configured oscillate, responsive to oscillations of the driving-mass structure in the horizontal plane, in a rotational motion about a vertical axis orthogonal to the horizontal plane;

a sensing-mass structure positioned over the surface of the substrate and configured to detect rotational movement of the driven-mass structure about first and second horizontal axes in the horizontal plane;

a sensing-electrode structure arranged on the surface of the substrate, the sensing-electrode structure capacitively coupled to the sensing-mass structure;

an anchorage assembly arranged within the central window of the driven-mass structure, the anchorage assembly including, a rigid structure suspended over the surface of the substrate, the rigid structure including a pair of rigid elements that extend along the second horizontal axis and that are arranged symmetrically with respect to the second horizontal axis in the central window;

elastic coupling elements coupling the pair of rigid elements to the driven-mass arrangement, each of the elastic coupling elements extending from a central portion of a respective rigid element to the driven-mass arrangement;

anchorage elements on the surface of the substrate, each anchorage element proximate to the sensing-electrode structure and spaced apart in the horizontal plane from the elastic coupling elements; and elastic decoupling elements coupled between end portions of the pair of rigid elements and the anchorage elements;

a reading-interface circuit electrically coupled to said micromechanical structure; and a microprocessor unit electrically coupled to said reading-interface circuit.

12. The electronic device of claim 11, wherein the sensing-electrode structure comprises a plurality of sensing electrodes formed on the surface of the substrate adjacent the driven-mass structure, and wherein the anchorage elements are positioned on the surface of the substrate within an envelope region of each of the plurality of sensing electrodes.

13. The electronic device of claim 11, wherein the electronic device comprises one of a mobile-communication portable device and a wearable type of electronic device.

14. The electronic device of claim 11, wherein the sensing-mass structure is further configured to perform a first detection of rotational movement out of the horizontal plane along a vertical axis in the presence of a first angular velocity about the first horizontal axis of the horizontal plane, and further configured to perform a second detection of rotational movement out of the horizontal plane in the presence of a second angular velocity about the second horizontal axis of the horizontal plane.

15. The electronic device of claim 11, wherein the substrate comprises a semiconductor material and wherein the driven-mass structure comprises polysilicon.

16. A gyroscope, comprising:
a detection structure having a main extension in a horizontal plane and including:
a substrate;
a driving mass;
a driven mass having a central window and being elastically coupled to the driving mass, the driving mass in operation of the gyroscope moving in a first detection movement of rotation out of the horizontal plane along a vertical axis in response to a first angular velocity about a first horizontal axis of the horizontal plane, and in operation of the gyroscope moving in a second detection movement of rotation out of the horizontal plane in response to a second angular velocity about a second horizontal axis of the horizontal plane;
a sensing electrode attached to the substrate and capacitively coupled to the sensing mass;
anchorage elements fixed to the substrate at a position proximate the sensing electrode in the horizontal plane; and
an anchorage assembly in the central window of the driven mass, the anchorage assembly elastically coupled to the driven mass and to the anchorage elements, the anchorage assembly including a pair of rigid elements that extend along the second horizontal axis and that are arranged symmetrically with respect to the second horizontal axis in the central window, each of the pair of rigid elements elastically coupled to the driven mass by a respective elastic connection element that extends from a central portion of a respective rigid element to the driven mass, and each of the pair of rigid elements coupled, at respective terminal ends of the rigid element, to respective anchorage elements by elastic decoupling elements, the elastic connection elements being a distance on the substrate from the anchorage elements.

17. The gyroscope of claim 16, wherein the substrate is a semiconductor substrate and wherein the elastic decoupling elements in operation decouple the rigid element from deformations of the substrate.

18. The gyroscope of claim 16, wherein the anchorage elements are positioned proximate to the sensing electrode to minimize a mean of changes in the gap responsive to deformations of the substrate.

19. A multi-axis MEMS gyroscope, comprising:
a micromechanical detection structure having a main extension in a horizontal plane, the micromechanical detection structure including:
a substrate including semiconductor material;
a driving-mass arrangement configured to be driven in a driving movement;
a driven-mass arrangement having a central window and a driven mass, the driven-mass arrangement coupled elastically to said driving-mass arrangement and configured to be driven in motion by said driving movement, the driven mass having internally a first pair of lateral windows set laterally with respect to the central window and aligned along a first horizontal axis;
a sensing-mass arrangement configured to perform, in response to motion of the driven-mass arrangement and in the presence of a first angular velocity about the first horizontal axis of the horizontal plane, a first detection movement of rotation out of the horizontal plane about a second horizontal axis of the horizontal plane, perpendicular to the first horizontal axis, and further configured to perform, in response to motion of the driven-mass arrangement and in the presence of a second angular velocity about the second horizontal axis of the horizontal plane, a second detection movement of rotation out of the horizontal plane about the first horizontal axis, wherein the sensing-mass arrangement includes a first pair of sensing masses, each of which is set within a respective lateral window of the first pair of lateral windows, is suspended above the substrate, and is coupled to the driven mass by respective elastic suspension elements of a torsional type, and each of the elastic suspension elements extend parallel to the second horizontal axis on opposite sides of a terminal portion of a respective sensing mass of the first pair of sensing masses so that the first pair of sensing masses are set in cantilever fashion above said substrate;

a sensing-electrode arrangement fixed with respect to the substrate and capacitively coupled to the sensing-mass arrangement; and an anchorage assembly arranged within the central window of the driven-mass arrangement, the anchorage assembly elastically coupled to the driven-mass arrangement, and configured to constrain the driven-mass arrangement to the substrate at anchorage elements, wherein said anchorage assembly includes a rigid structure, suspended above said substrate and elastically coupled to said driven mass by elastic connection elements at a central portion of the rigid structure, and coupled to said anchorage elements by elastic decoupling elements at end portions of the rigid structure, and said anchorage elements are positioned at a distance from said elastic connection elements and proximate said sensing-electrode arrangement in the horizontal plane to reduce, in response to deformations of said substrate, variations of gaps between said sensing-mass arrangement and said sensing-electrode arrangement.

20. The multi-axis MEMS gyroscope according to claim 19, wherein said sensing-electrode arrangement includes a first pair of sensing electrodes that are on the substrate and are aligned with the first pair of sensing masses.

21. The gyroscope according to claim 20, wherein said driven mass includes a second pair of lateral windows set laterally with respect to the central window and aligned along the second horizontal axis, the sensing-mass arrangement includes a second pair of sensing masses, each of which is set within a respective lateral window of the second pair of lateral windows and is coupled to the driven mass by respective elastic suspension elements, and the sensing-electrode arrangement includes a second pair of sensing electrodes that are on the substrate and are aligned with the second pair of sensing masses.

* * * * *